United States Patent
Chiu et al.

(10) Patent No.: US 10,170,579 B2
(45) Date of Patent: Jan. 1, 2019

(54) SURFACE TREATMENT AND PASSIVATION FOR HIGH ELECTRON MOBILITY TRANSISTORS

(71) Applicant: Taiwan Semiconductor Manufacturing Company, Ltd., Hsin-Chu (TW)

(72) Inventors: Han-Chin Chiu, Kaohsiung (TW); Cheng-Yuan Tsai, Hsin-Chu County (TW)

(73) Assignee: TAIWAN SEMICONDUCTOR MANUFACTURING COMPANY, LTD., Hsin-Chu (TW)

( * ) Notice: Subject to any disclaimer, the term of this patent is extended or adjusted under 35 U.S.C. 154(b) by 0 days.

(21) Appl. No.: 15/600,165

(22) Filed: May 19, 2017

(65) Prior Publication Data
US 2017/0263729 A1    Sep. 14, 2017

Related U.S. Application Data

(62) Division of application No. 14/879,908, filed on Oct. 9, 2015, now Pat. No. 9,666,683.

(51) Int. Cl.
| | | |
|---|---|---|
| H01L 29/66 | (2006.01) |
| H01L 29/20 | (2006.01) |
| H01L 29/778 | (2006.01) |
| H01L 23/29 | (2006.01) |
| H01L 29/423 | (2006.01) |

(Continued)

(52) U.S. Cl.
CPC ...... *H01L 29/66431* (2013.01); *H01L 23/291* (2013.01); *H01L 29/2003* (2013.01); *H01L 29/42376* (2013.01); *H01L 29/513* (2013.01); *H01L 29/66462* (2013.01); *H01L 29/778* (2013.01); *H01L 29/7786* (2013.01); *H01L 29/41766* (2013.01); *H01L 29/518* (2013.01)

(58) Field of Classification Search
CPC .......... H01L 29/66431; H01L 29/2003; H01L 29/66462
See application file for complete search history.

(56) References Cited

U.S. PATENT DOCUMENTS

| | | | |
|---|---|---|---|
| 6,534,801 B2 | 3/2003 | Yoshida | |
| 6,678,876 B2 | 1/2004 | Stevens et al. | |
| 6,849,882 B2 | 2/2005 | Chavarkar et al. | |

(Continued)

FOREIGN PATENT DOCUMENTS

| | | |
|---|---|---|
| DE | 2011105988 | 9/2014 |
| TW | 396379 | 7/2000 |

(Continued)

OTHER PUBLICATIONS

German Office Action dated Aug. 1, 2016, Application No. 10.2015. 117.874.5, 5 pages. (No translation).

*Primary Examiner* — Douglas M Menz
(74) *Attorney, Agent, or Firm* — Haynes and Boone, LLP

(57) ABSTRACT

A High Electron Mobility Transistor (HEMT) and a method of forming the same are disclosed. The HEMT includes a first III-V compound layer having a first band gap and a second III-V compound layer having a second band gap over the first III-V compound layer, wherein the second band gap is greater than the first band gap. The HEMT further includes a first oxide layer over the second III-V compound layer; a first interfacial layer over the first oxide layer; and a passivation layer over the first interfacial layer.

20 Claims, 17 Drawing Sheets

(51) Int. Cl.
*H01L 29/51* (2006.01)
*H01L 29/417* (2006.01)

(56) References Cited

U.S. PATENT DOCUMENTS

| | | |
|---|---|---|
| 6,908,799 B2 | 6/2005 | Morizuka |
| 7,700,973 B2 | 4/2010 | Shen et al. |
| 7,851,284 B2 | 12/2010 | Zhang et al. |
| RE44,538 E | 10/2013 | Redwing et al. |
| 8,803,158 B1 | 8/2014 | Chiu et al. |
| 8,895,993 B2 | 11/2014 | Kalnitsky et al. |
| 8,963,162 B2 | 2/2015 | Hsu et al. |
| 9,343,542 B2 | 5/2016 | Kalnitsky et al. |
| 2012/0149176 A1 | 6/2012 | Chen |
| 2012/0238076 A1 | 9/2012 | Chen |
| 2014/0231816 A1 | 8/2014 | Chiu et al. |
| 2015/0060861 A1 | 3/2015 | Chiu et al. |
| 2015/0060873 A1 | 3/2015 | Chiu et al. |
| 2017/0104083 A1 | 4/2017 | Chiu et al. |

FOREIGN PATENT DOCUMENTS

| | | |
|---|---|---|
| TW | 567528 | 12/2003 |
| TW | I412947 | 10/2013 |
| TW | 201440222 | 10/2014 |

SURFACE TREATMENT AND PASSIVATION FOR HIGH ELECTRON MOBILITY TRANSISTORS

PRIORITY

This is a divisional of U.S. application Ser. No. 14/879,908, filed Oct. 9, 2015, herein incorporated by reference in its entirety.

BACKGROUND

In semiconductor technology, Group III-Group V (or III-V) semiconductor compounds may be used to form various integrated circuit (IC) devices, such as high power field-effect transistors (FETs), high frequency transistors, or high electron mobility transistors (HEMTs). A HEMT is a field effect transistor having a two dimensional electron gas (2-DEG) layer close to a junction between two materials with different band gaps (i.e., a heterojunction). The 2-DEG layer is used as the transistor channel instead of a doped region, as is generally the case for metal oxide semiconductor field effect transistors (MOSFETs). Compared with MOSFETs, HEMTs have a number of attractive properties such as high electron mobility and the ability to transmit signals at high frequencies.

When manufacturing HEMTs with III-V compounds, it is desirable to passivate the surface of the III-V compounds with a dielectric material layer (passivation layer) to prevent the III-V compounds from freely reacting with ambient air. Current methods of passivizing the surface of III-V compounds are not satisfactory in all respects. Sometimes, the interfacial density of states (Dit) at the interface between the passivation layer and the III-V compounds are undesirably high, causing device performance issues and reliability issues such as drain current degradation, large threshold voltage (Vt) fluctuation, and large off-current leakage. Accordingly, improvements in this area are needed.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

DETAILED DESCRIPTION

Figure 1A:
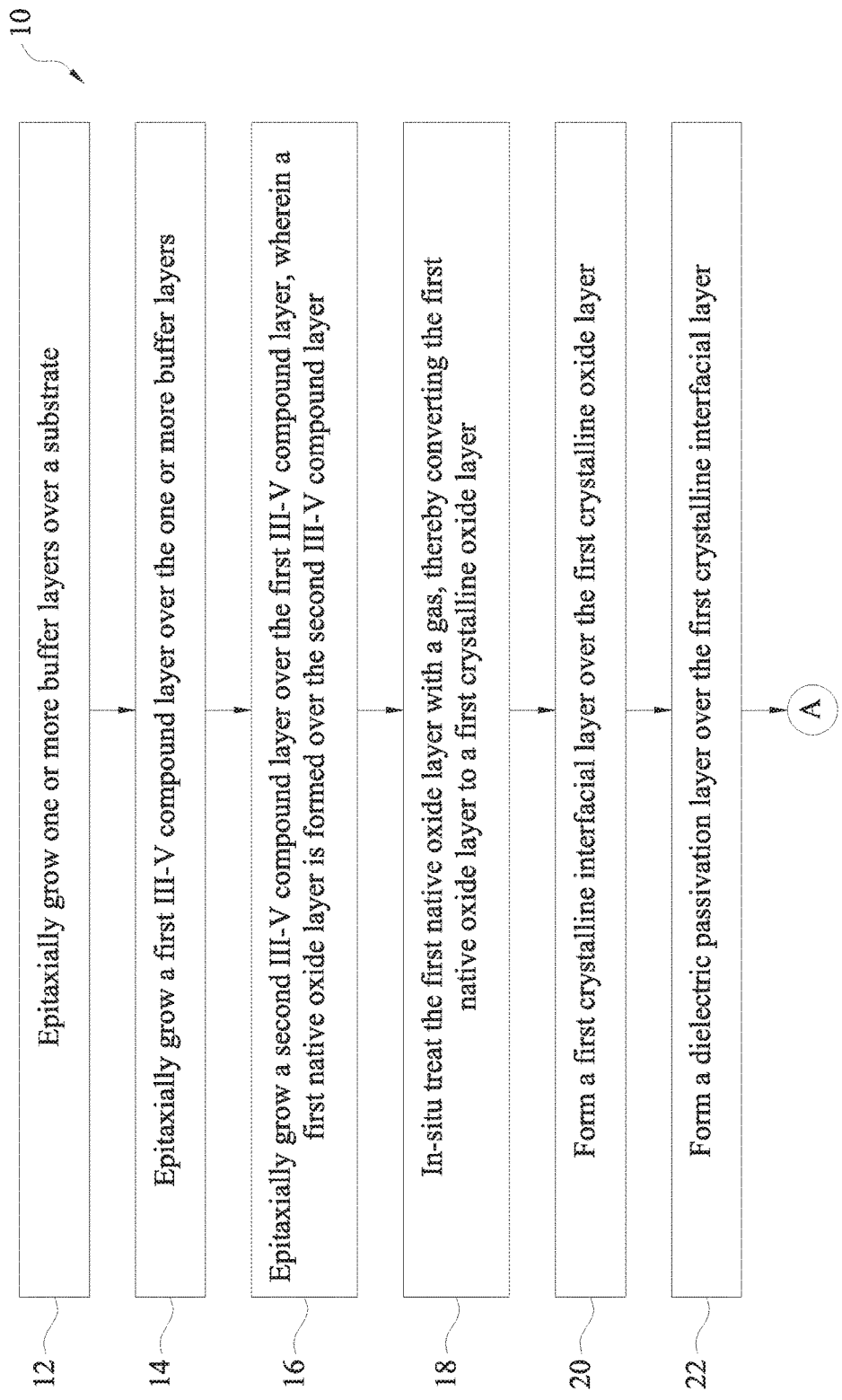
FIGS. 1A and 1B are a flow chart of a method of forming a HEMT according to various aspects of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The present disclosure is generally related to semiconductor devices and methods of forming the same. More particularly, the present disclosure is related to a high electron mobility transistor (HEMT) and methods of forming the same. One object of the present disclosure is to reduce the interfacial density of states (Dit) between a passivation layer and a III-V compound layer in the HEMT.

Figure 1B:
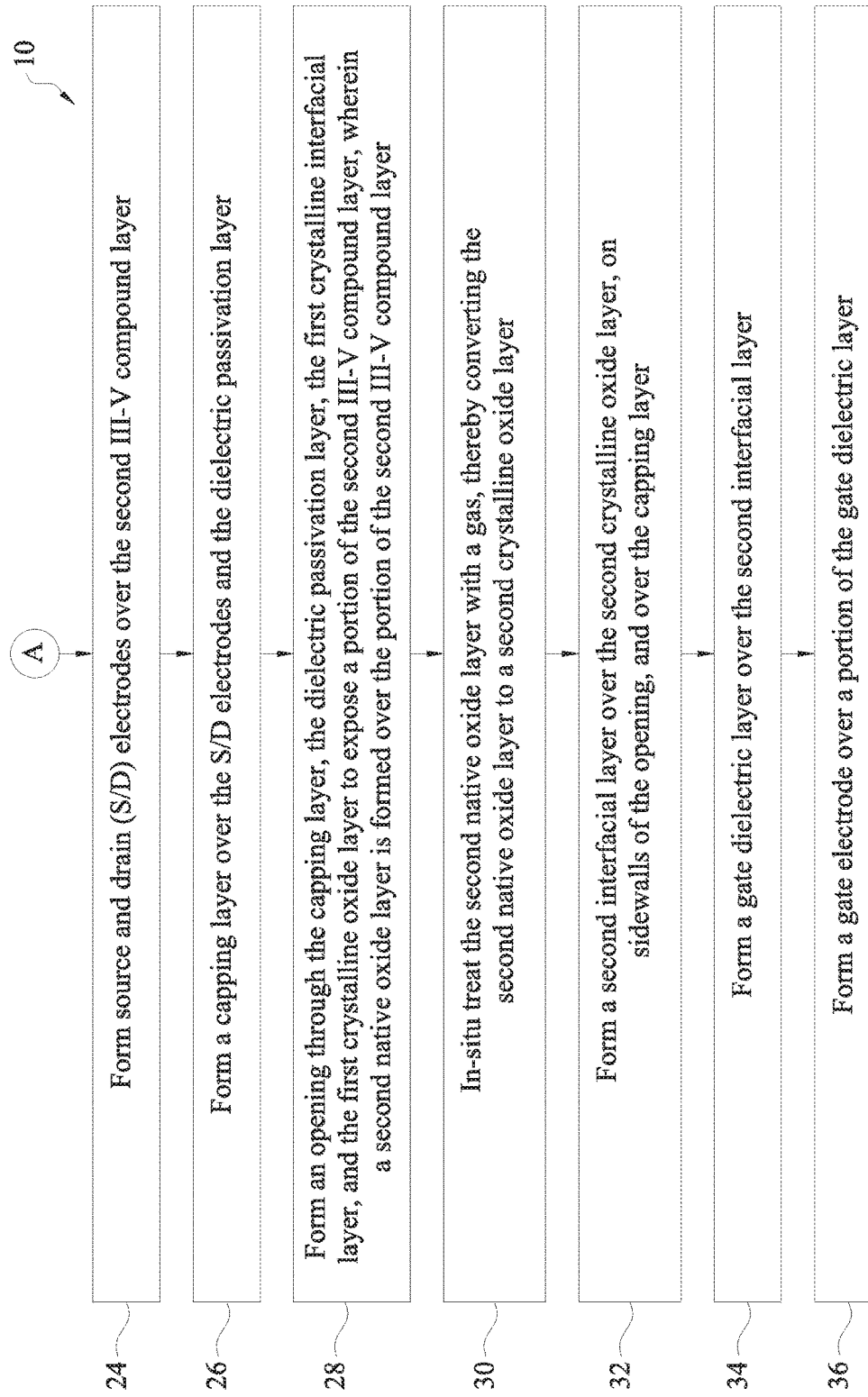

FIGS. 1A and 1B show a flow chart of a method 10 of forming a semiconductor device, according to various aspects of the present disclosure. The method 10 is merely an example, and is not intended to limit the present disclosure beyond what is explicitly recited in the claims. Additional operations can be provided before, during, and after the method 10, and some operations described can be replaced, eliminated, or moved around for additional embodiments of the method. An embodiment of the method 10 is described in conjunction with FIGS. 2A-2U which are cross-sectional views of a semiconductor device 100 in various stages of a gate-last manufacturing process, where a gate electrode is formed after the formation of source and drain (S/D) electrodes. Another embodiment of the method 10 is described in conjunction with FIGS. 3A-3G which are cross-sectional views of a semiconductor device 200 in various stages of a gate-first manufacturing process, where a gate electrode is formed before the formation of source and drain (S/D) electrodes.

The semiconductor devices 100 and 200 are provided for illustration purposes and do not necessarily limit the embodiments of the present disclosure to any number of devices, any number of regions, or any configuration of structures or regions. The semiconductor devices 100 and 200 each include a HEMT. Therefore, the semiconductor devices 100 and 200 are also referred to as the HEMTs 100 and 200 respectively.

Figure 2A:
FIGS. 2A, 2B, 2C, 2D, 2E, 2F, 2G, 2H, 2I, 2J, 2K, 2L, 2M, 2N, 2O, 2P, 2Q, 2R, 2S, 2T, and 2U are cross-sectional views of a portion of a HEMT in various stages of a manufacturing flow according to the method in FIGS. 1A and 1B, in accordance with an embodiment.

Referring to FIG. 1A, at operation 12, the method 10 epitaxially grows one or more buffer layers over a substrate 102. The one or more buffer layers may function to reduce lattice mismatch between the substrate 102 and an overlying III-V compound layer to be subsequently formed. Referring to FIG. 2A, two buffer layers 104 and 106 are epitaxially grown over the substrate 102 in this embodiment.

In various embodiments, the substrate 102 includes a silicon substrate (e.g. a wafer). Alternatively, the substrate 102 may include a silicon carbide (SiC) substrate or a sapphire substrate. In embodiments, the substrate 102 may be a bulk substrate formed of a bulk material, or a composite substrate including a plurality of layers that are formed of different materials.

In an embodiment, the buffer layer 104 includes an aluminum nitride (AlN) layer. The buffer layer 104 may have a thickness in a range from about 10 nanometers (nm) to about 300 nm. The buffer layer 104 may include a single layer or a plurality of layers, and may be formed by metal organic vapor phase epitaxy (MOVPE) or other suitable epitaxy methods.

In an embodiment, the buffer layer 106 includes an aluminum gallium nitride (AlGaN) layer. The buffer layer 106 may have a thickness in a range from about 500 nm to about 1000 nm, and may be formed by MOVPE or other suitable epitaxy methods. In some embodiments, the buffer layer 106 is formed to have a graded structure, i.e. the relative amount of the respective aluminum and/or gallium content change with depth in the layer throughout a part or the total thickness of the buffer layer 106. The graded structure may provide for better lattice matching between the substrate 102 and a subsequently formed overlying III-V compound layer.

Figure 2B:

At operation 14, the method 10 (FIG. 1A) epitaxially grows a first III-V compound layer 108 over the buffer layer 106. Referring to FIG. 2B, in the present embodiment, the III-V compound layer 108 is a gallium nitride (GaN) layer. The GaN layer 108 may be epitaxially grown by using, for example, MOVPE, during which a gallium-containing precursor and a nitrogen-containing precursor are used. The gallium-containing precursor may include trimethylgallium (TMG), triethylgallium (TEG), or other suitable gallium-containing chemicals. The nitrogen-containing precursor may include ammonia ($NH_3$), tertiarybutylamine (TBAm), phenyl hydrazine, or other suitable nitrogen-containing chemicals. The III-V compound layer 108 may have a thickness in a range from about 0.5 micron to about 10 microns. The III-V compound layer 108 may be undoped. Alternatively, it may be unintentionally doped, such as lightly doped with n-type dopants due to a precursor used for forming the III-V compound layer 108, with no dopant that may cause the III-V compound layer 108 to be n-type or p-type intentionally added.

Figure 2C:

At operation 16, the method 10 (FIG. 1A) epitaxially grows a second III-V compound layer 110 over the first III-V compound layer 108. Referring to FIG. 2C, the III-V compound layer 110 has a band gap greater than the band gap of the III-V compound layer 108. An interface 109 is formed between the III-V compound layers 108 and 110. When the HEMT 100 is in operation, a carrier channel 107 is formed and located in the III-V compound layer 108 near the interface 109. This carrier channel 107 is known as a two-dimensional electron gas (2-DEG). In the present embodiment, the III-V compound layer 110 is an aluminum gallium nitride (AlGaN) layer. For example, the III-V compound layer 110 may be an $Al_xGa_{1-x}N$ layer with $0.05 \leq x \leq 1$. In embodiments, the AlGaN layer 110 may have a thickness ranging from about 3 nm to about 50 nm. The AlGaN layer 110 may be epitaxially grown by MOVPE or other suitable epitaxy methods. In one example, the AlGaN layer 110 may be grown using an aluminum-containing precursor, a gallium-containing precursor, and a nitrogen-containing precursor. The aluminum-containing precursor may include trimethylaluminum (TMA), triethylaluminum (TEA), or other suitable aluminum-containing chemicals. The gallium-containing precursor and the nitrogen-containing precursor may be selected from the same candidate precursors used for forming the GaN layer 108. In an embodiment, the AlGaN layer 110 has a thickness ranging from about 3 nm to about 50 nm.

The III-V compound layer 110 is grown in a process chamber that may be substantially free of air. However, air, particularly oxygen, may still exist in the process chamber. Due to the active nature of the III-V compound layer 110, a native oxide layer 112 may form at the top surface of the III-V compound layer 110, as shown in FIG. 2C. For example, when the III-V compound layer 110 is formed of AlGaN, the native oxide layer 112 may include gallium oxide ($GaO_x$) or aluminum oxide ($AlO_x$). The native oxide layer 112 has an amorphous structure. Therefore, it is undesirable for the performance and reliability of the HEMT 100 even though its thickness may be relatively small (e.g., 1~2 nm).

Figure 2D:
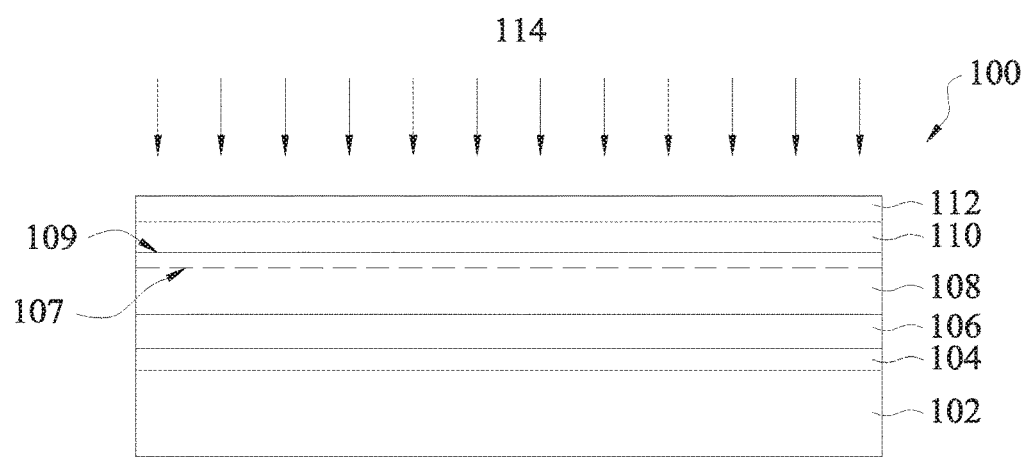
Figure 2E:

At operation 18, the method 10 (FIG. 1A) in-situ treats the native oxide layer 112 with a gas 114. Here, the term "in-situ" means that the native oxide layer 112 is treated in the process chamber where the III-V compound layer 110 is grown, without breaking vacuum. Referring to FIG. 2D, in the present embodiment, the gas 114 includes ammonia ($NH_3$). In another embodiment, the gas 114 includes one of: $NH_3$, $N_2$, $H_2$, or a combination thereof. Additionally or alternatively, the gas 114 may include $Cl_2$ or $BCl_3$. The operation 18 effectively crystallizes or recrystallizes the native oxide layer 112 into a crystalline oxide layer 116 (FIG. 2E). To achieve that purpose, the operation 18 is performed at a suitable temperature. If the temperature is too low, recrystallization of the native oxide layer 112 may not occur. If the temperature is too high, the semiconductor device 100 may be damaged. In an embodiment, the operation 18 is performed at a temperature ranging from about 300 Celsius (° C.) to about 900° C. and at a low pressure, such as lower than 300 torr. Further, the operation 18 may be performed continuously for 3 minutes or longer, or intermittently for total treatment duration of 3 minutes or longer. In embodiments, the crystalline oxide layer 116 may have a thickness of up to 3 nm. In an embodiment where the native oxide layer 112 includes gallium oxide ($GaO_x$), the crystalline oxide layer 116 includes crystalline gallium oxynitride (GaON). In an embodiment where the native oxide layer 112 includes aluminum oxide ($AlO_x$), the crystalline oxide layer 116 includes crystalline aluminum oxynitride (AlON).

Figure 2F:
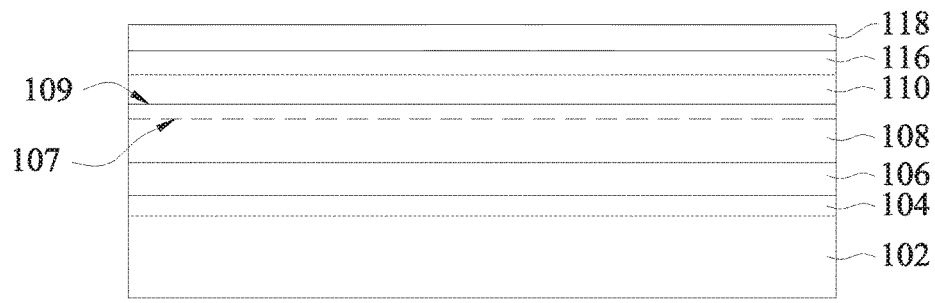

At operation 20, the method 10 (FIG. 1A) forms a crystalline interfacial layer 118 over the crystalline oxide layer 116. Referring to FIG. 2F, the crystalline interfacial layer 118 may have a single crystalline structure, or may have a polycrystalline structure. Because both the interfacial layer 118 and the oxide layer 116 have crystalline structures, the interfacial density of states (Dit) between the crystalline interfacial layer 118 and the III-V compound layer 110 is low and the resulting HEMT 100 has small threshold voltage (Vt) shift and high reliability. In an embodiment, the crystalline interfacial layer 118 includes a semiconductor material such as aluminum nitride (AlN), indium aluminum gallium nitride ($In_xAl_yGa_zN$ with $x+y+z=1$ and $0 \leq x, y, z \leq 1$), and boron nitride (BN). In embodiments, the crystalline interfacial layer 118 may have a thickness ranging from about 5 angstrom (Å) to about 100 Å. In an embodiment, the operation 20 is performed in-situ with the formation of the III-V compound layer 110 and the treatment of the native oxide layer 112, with no vacuum break between the operations 16, 18, and 20. In an alternative embodiment, the operation 20 is performed ex-situ, i.e., in a process chamber different from where the III-V compound layer 110 is grown and the native oxide layer 112 is treated. In various embodiments, the crystalline interfacial layer 118 may be formed using epitaxy, atomic layer deposition (ALD), physical vapor deposition (PVD), or chemical vapor deposition (CVD).

Figure 2G:
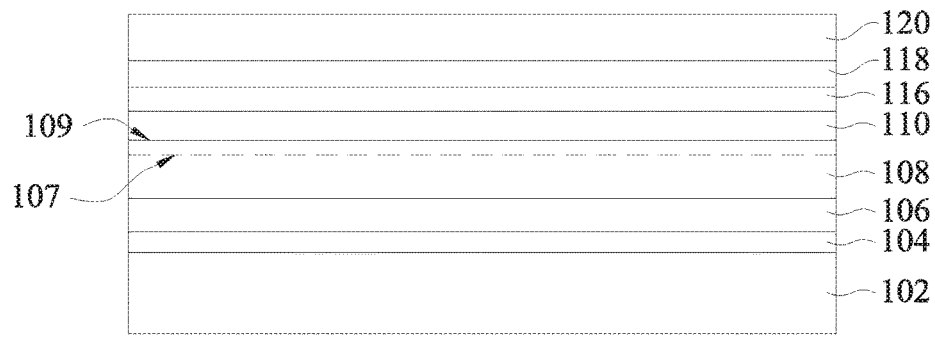
Figure 2H:

At operation 22, the method 10 (FIG. 1A) forms a dielectric passivation layer 120 over the crystalline interfacial layer 118, as shown in FIG. 2G. In some embodiments, the dielectric passivation layer 120 has a thickness in a range from about 30 nm to about 500 nm. In an embodiment, the dielectric passivation layer 120 includes silicon oxide, silicon nitride, or a combination thereof. The dielectric passivation layer 120 may be deposited using CVD, ALD, PVD, or other suitable methods. For example, when comprising silicon nitride, the dielectric passivation layer 120 may be formed by performing a low pressure chemical vapor deposition (LPCVD) using $SiH_4$ and $NH_3$ as precursor gases. The dielectric passivation layer 120 protects the underlying crystalline interfacial layer 118, the crystalline oxide layer 116, and the III-V compound layer 110 from being damaged by subsequent fabrication processes.

Figure 2I:
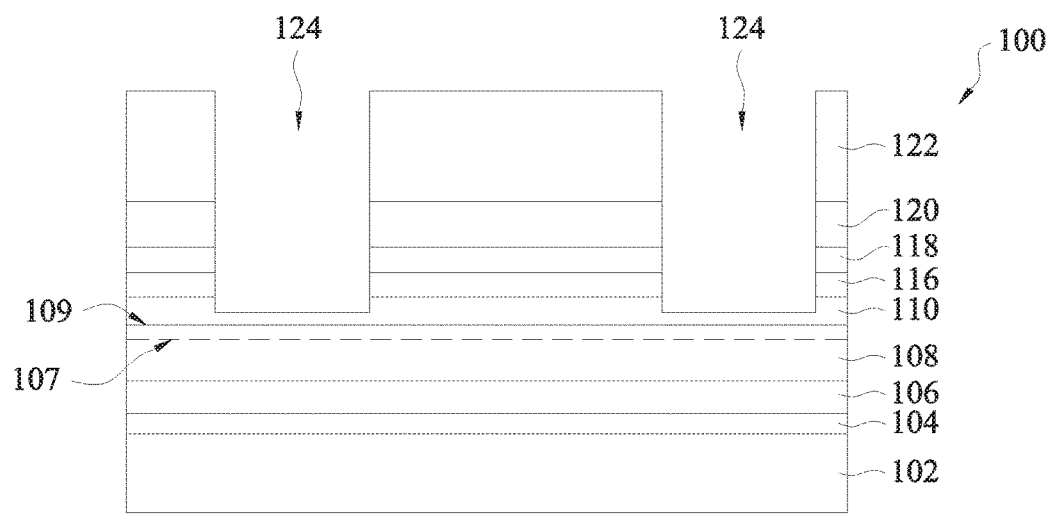
Figure 2J:
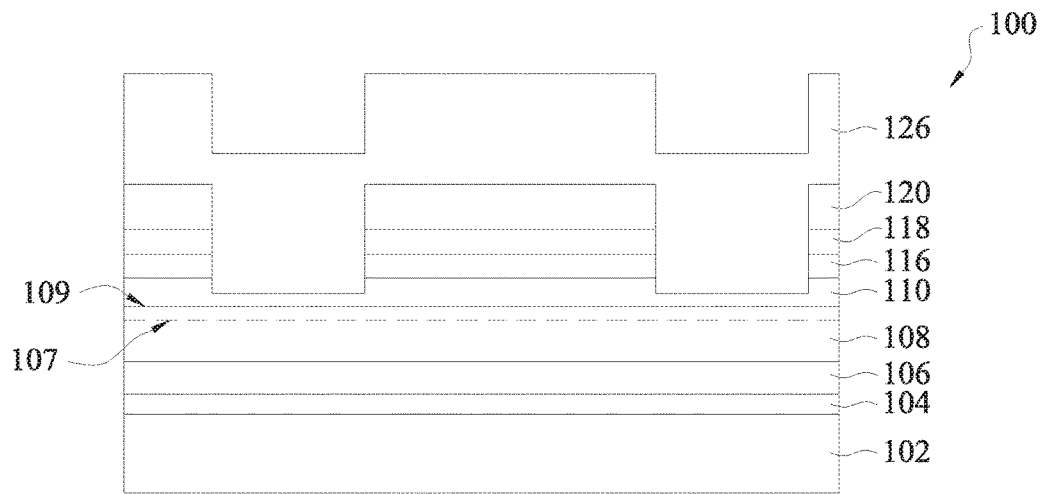
Figure 2K:
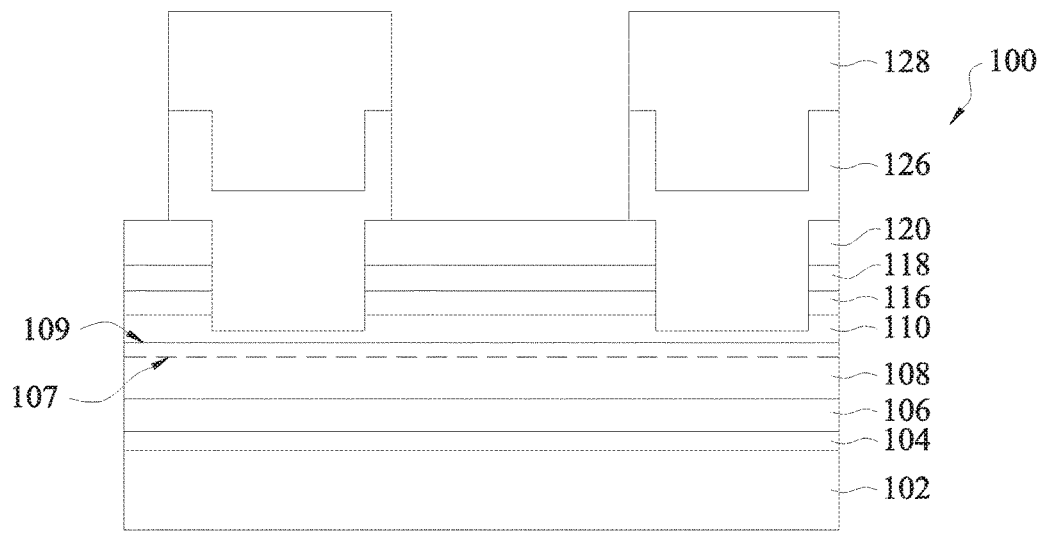
Figure 2L:
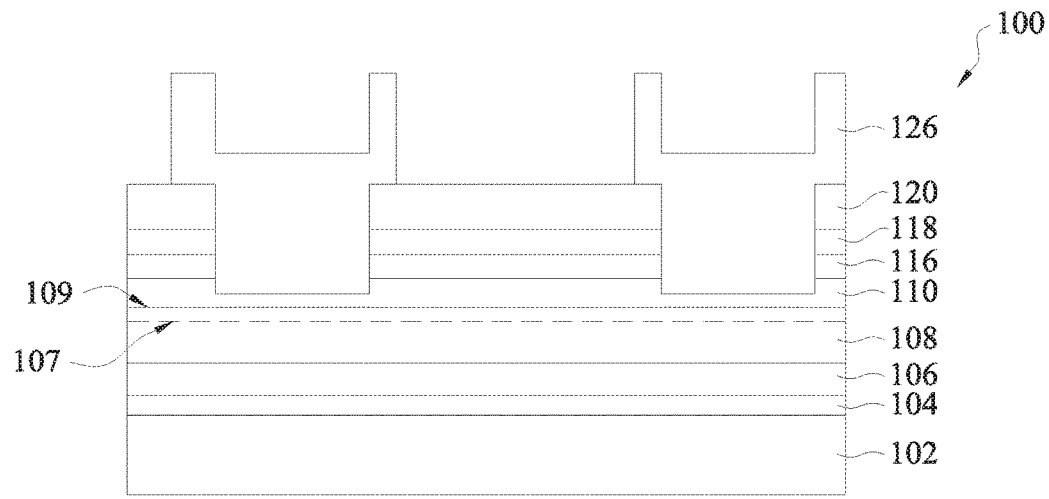

At operation 24, the method 10 (FIG. 1B) forms source and drain (S/D) electrodes 126 (FIG. 2L) over the III-V compound layer 110. In an exemplary embodiment, this involves multiple processes including photolithography, etching, and deposition processes, which are illustrated in FIGS. 2H-2L. The photolithography process may include forming a photoresist (or resist) 122 over the dielectric passivation layer 120 (FIG. 2H), exposing the resist 122 using a pattern that defines geometrical shapes for S/D contact holes, performing post-exposure bake processes, and developing the resist 122 to form a masking element (also referred to as the masking element 122). The masking element 122, or a derivative thereof, is then used for etching S/D contact holes (or openings) 124 through the dielectric passivation layer 120, the crystalline interfacial layer 118, and the crystalline oxide layer 116, thereby exposing portions of the III-V compound layer 110 (FIG. 2I). The etching processes may include one or more dry etching processes, wet etching processes, and other suitable etching techniques. The masking element 122 is subsequently removed, and a metal layer 126 is deposited over the dielectric passivation layer 120 and filling in the S/D contact holes 124 (FIG. 2J). The metal layer 126 may include an elemental metal such as titanium (Ti), cobalt (Co), nickel (Ni), tungsten (W), platinum (Pt), tantalum (Ta), palladium (Pd), and molybdenum (Mo). Alternatively, the metal layer 126 may include a metallic nitride such as titanium nitride (TiN), a metallic or conductive oxide, or a metal alloy such as aluminum copper (AlCu). The metal layer 126 may be deposited using CVD, PVD, plating, or other methods. Subsequently, the metal layer 126 is patterned using another photolithography process and another etching process (FIG. 2K). The photolithography process forms and defines a masking element 128 (e.g., a patterned resist) overlying the metal layer 126. Then, the metal layer 126 is etched using the masking element 128 as an etch mask. The etching process stops at the dielectric passivation layer 120. The remaining portions of the metal layer 126 form S/D electrodes (or contacts), which are also referred to as the S/D electrodes 126. The masking element 128 is subsequently removed (FIG. 2L). In an embodiment, a thermal annealing process is applied to the S/D electrodes 126. The thermal annealing process causes the S/D electrodes 126 to react with the III-V compound layers 110 and 108 to form an inter-metallic compound (not shown). The inter-metallic compound connects to the opposite ends of the carrier channel 107 and provides for more effective electrical connection to the carrier channel 107.

Figure 2M:
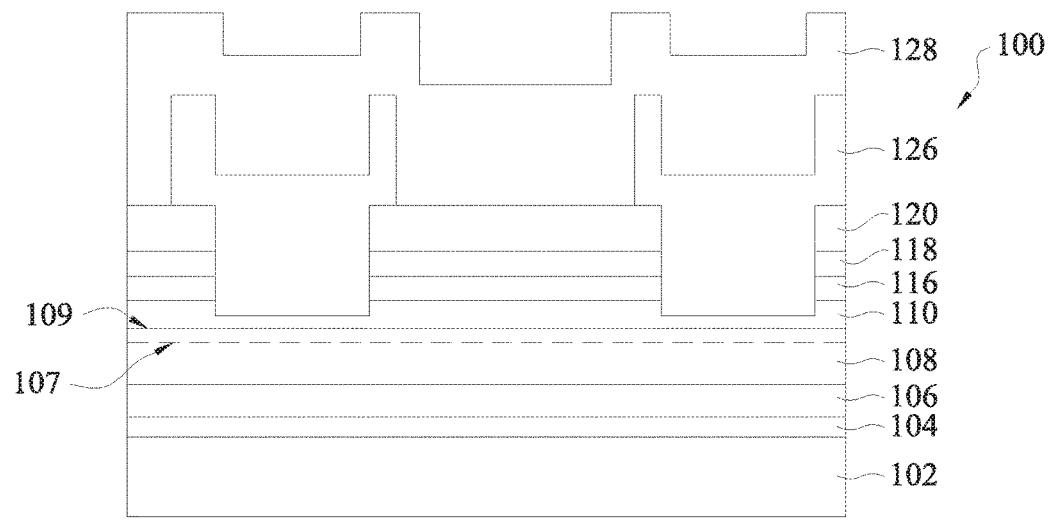

At operation 26, the method 10 (FIG. 1B) forms a capping layer 128 over the S/D electrodes 126 and the dielectric passivation layer 120. Referring to FIG. 2M, the capping layer 128 may include an oxide, a nitride, or other dielectric materials. For example, the capping layer 128 may include silicon nitride, $SiN_x$ with $0.5 \leq x \leq 1.33$, or silicon oxide, $SiO_x$ with $0.5 \leq x \leq 2.1$. In embodiments, the capping layer 128 may include a single layer or a multi-layer structure. The capping layer 128 may be formed using CVD, PVD, or other deposition techniques.

Figure 2N:
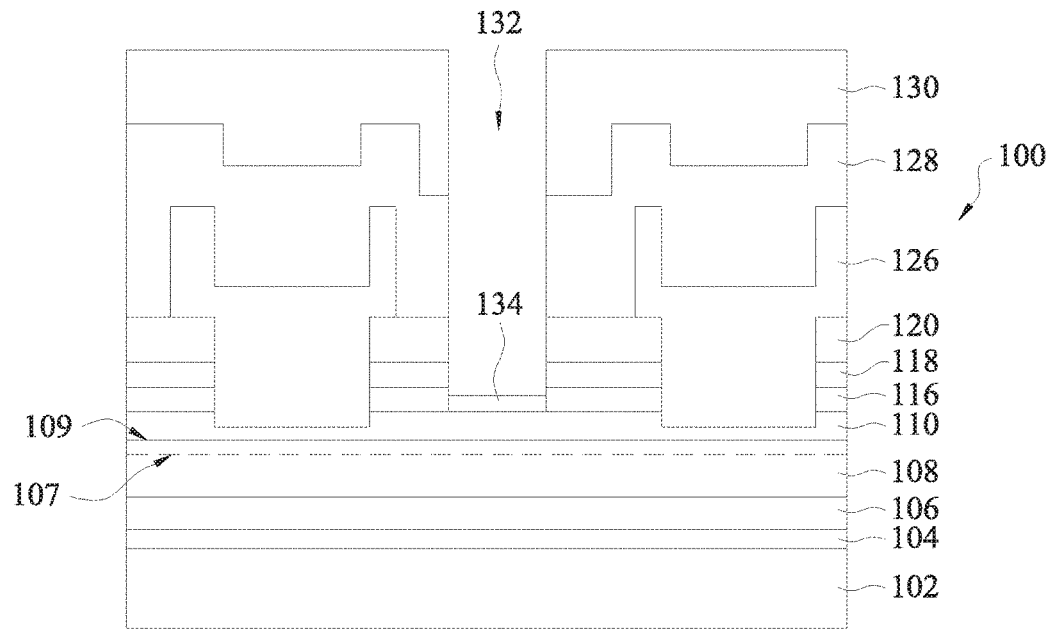

At operation 28, the method 10 (FIG. 1B) forms an opening 132 through the capping layer 128, the dielectric passivation layer 120, the crystalline interfacial layer 118, and the crystalline oxide layer 116. Referring to FIG. 2N, shown therein is the semiconductor device 100 with the opening 132. In the present embodiment, the operation 28 includes a photolithography process and one or more etching processes. The photolithography process forms a masking element 130 (e.g., a patterned resist) over the capping layer 128. The one or more etching processes etch the various layers 128, 120, 118, and 116 using the masking element 130 as an etch mask. The one or more etching processes may include dry etching, wet etching, or other etching techniques. A portion of the III-V compound layer 110 is exposed in the opening 132. Because the III-V compound layer 110 is very active and the etching process chamber is not totally free of oxygen, a native oxide layer 134 is formed over the portion of the III-V compound layer 110 that is exposed in the opening 132. The native oxide layer 134 generally has an amorphous structure and is not desirable for the performance of the HEMT 100.

Figure 2O:
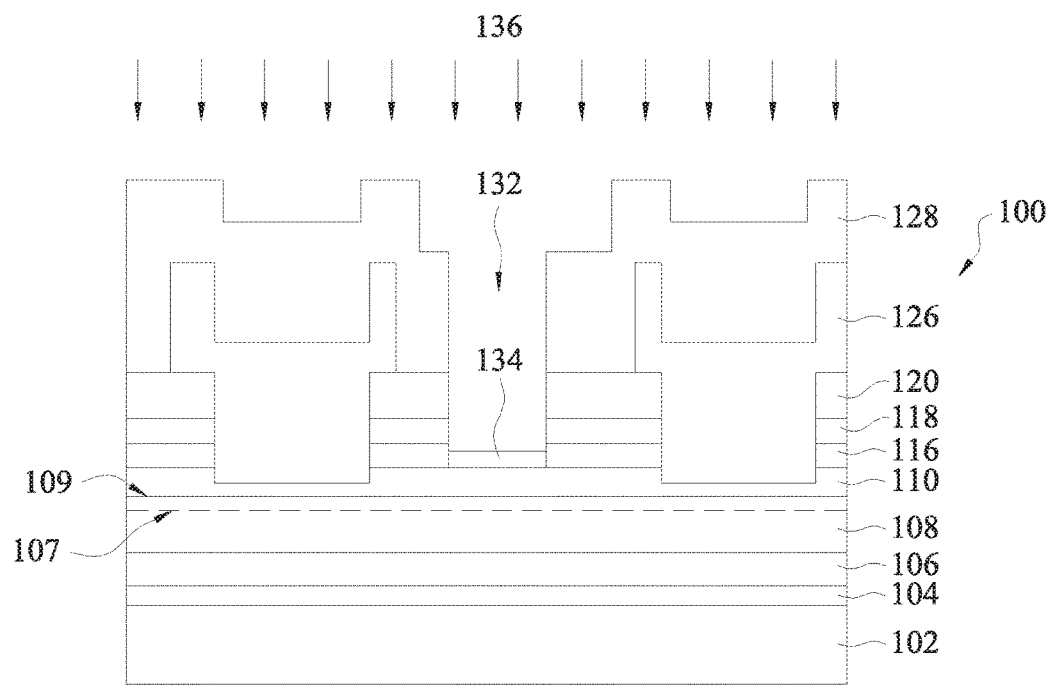
Figure 2P:
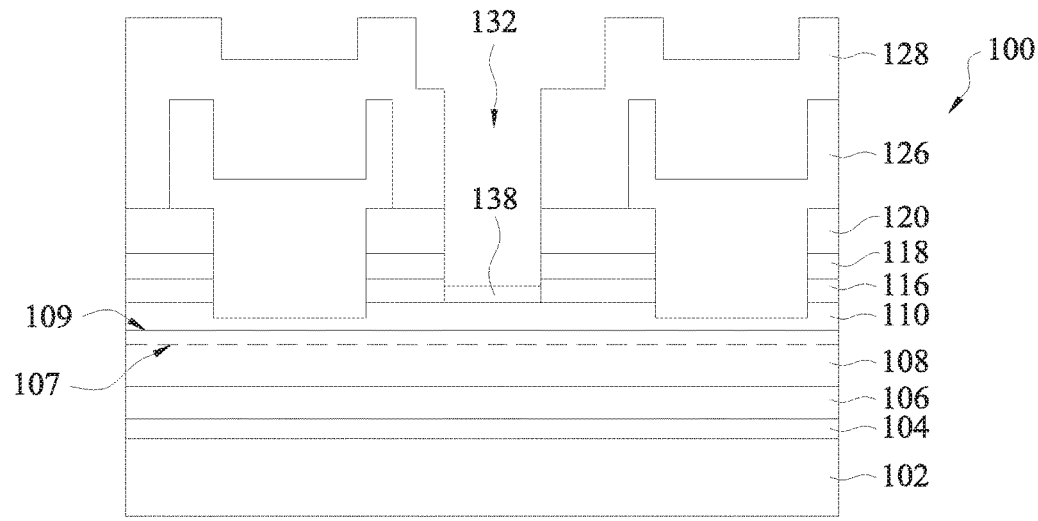

At operation 30, the method 10 (FIG. 1B) treats the native oxide layer 134 with a gas 136, thereby converting the native oxide layer 134 to a crystalline oxide layer 138 (FIGS. 2O and 2P). In the present embodiment, the operation 30 is in-situ performed in the process chamber where the opening 132 is formed. Referring to FIG. 2O, the masking element 130 of FIG. 2N is removed and the gas 136 is applied to the native oxide layer 134 in a controlled environment. In an embodiment, the gas 136 includes one of: $NH_3$, $N_2$, $H_2$, or a combination thereof. Additionally or alternatively, the gas 114 may include $Cl_2$ or $BCl_3$. In an embodiment, the gas 136 is applied in an environment that has a temperature ranging from about 300° C. to about 900° C. and at a low pressure such as lower than 300 torr. Further, the gas 136 may be applied continuously for 3 minutes or longer, or intermittently for total treatment duration of 3 minutes or longer. The operation 30 effectively crystallizes or recrystallizes the native oxide layer 134 (e.g., $GaO_x$ or $AlO_x$) into the crystalline oxide layer 138 (e.g., GaON or AlON respectively). In embodiments, the gas 136 may be the same as or different from the gas 114 (FIG. 2D). Furthermore, the crystalline oxide layers 138 and 116 may have the same composition and thickness, or may have different compositions and/or thicknesses. In an embodiment, the crystalline oxide layer 138 has a thickness of up to 3 nm.

Figure 2Q:
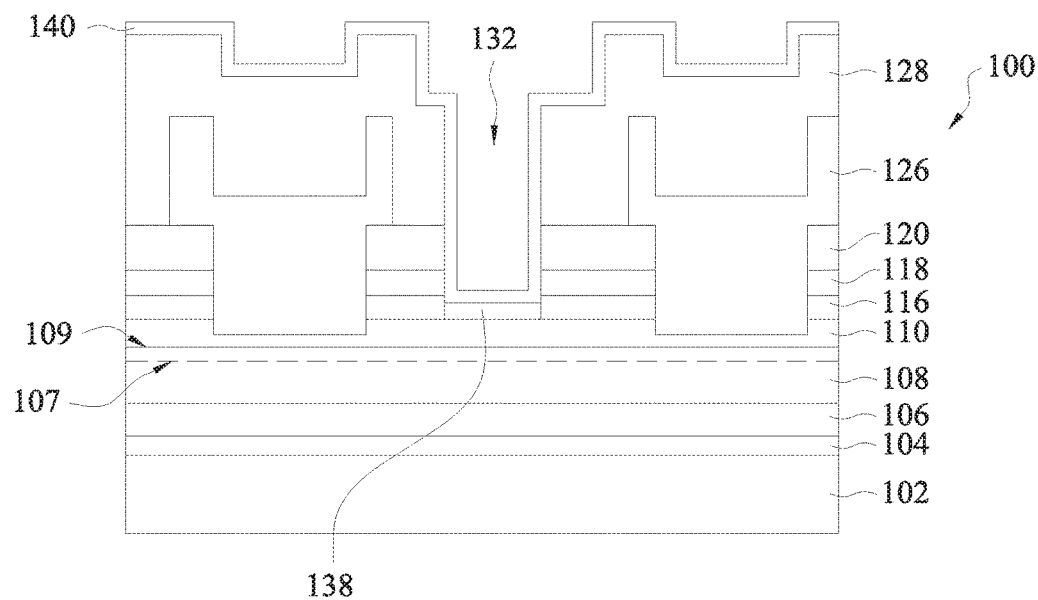

At operation 32, the method 10 (FIG. 1B) forms another interfacial layer 140 over the crystalline oxide layer 138, on sidewalls (or interior surfaces) of the opening 132, and over the capping layer 128. Referring to FIG. 2Q, the interfacial layer 140 is formed to have a thickness ranging from about 5 Å to about 100 Å in the present embodiment. In an embodiment, the interfacial layer 140 includes aluminum nitride (AlN). In another embodiment, the interfacial layer 140 includes indium aluminum gallium nitride $In_xAl_yGa_zN$ with x+y+z=1 and 0≤x, y, z≤1, or boron nitride (BN). The interfacial layer 140 may have the same composition and/or thickness as the interfacial layer 118. Alternatively, the interfacial layers 140 and 118 may have different compositions and/or thicknesses. In an embodiment, the interfacial layer 140 has a crystalline structure in at least the portion of the interfacial layer 140 over the crystalline oxide layer 138. To further this embodiment, the interfacial density of states (Dit) between the interfacial layer 140 and the III-V compound layer 110 is advantageously low, which improves the threshold voltage (Vt) stability of the HEMT 100. In an embodiment, the operation 32 is performed in-situ with the treatment of the native oxide layer 134, with no vacuum break between the operations 30 and 32. In an alternative embodiment, the operation 32 is performed ex-situ, i.e., in a process chamber different from where the native oxide layer 134 is treated. In various embodiments, the interfacial layer 140 may be formed using epitaxy, atomic layer deposition (ALD), physical vapor deposition (PVD), or chemical vapor deposition (CVD).

Figure 2R:
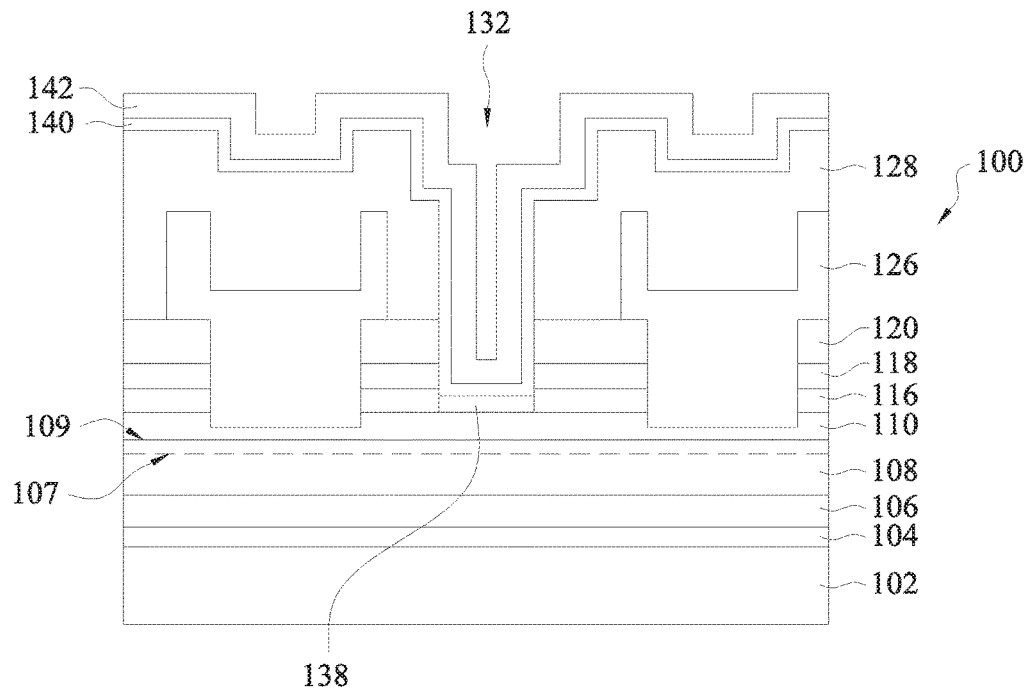

At operation 34, the method 10 (FIG. 1B) forms a gate dielectric layer 142 over the interfacial layer 140. Referring to FIG. 2R, the gate dielectric layer 142 includes a portion extending into the opening 132 and another portion overlying the capping layer 128 and the interfacial layer 140. In an embodiment, the gate dielectric layer 142 includes silicon nitride, silicon oxide, or aluminum oxide. The gate dielectric layer 142 may be deposited using CVD, ALD, PVD, or other deposition techniques. In an embodiment, the gate dielectric layer 142 is formed to have a thickness ranging from about 50 Å to about 500 Å.

Figure 2S:
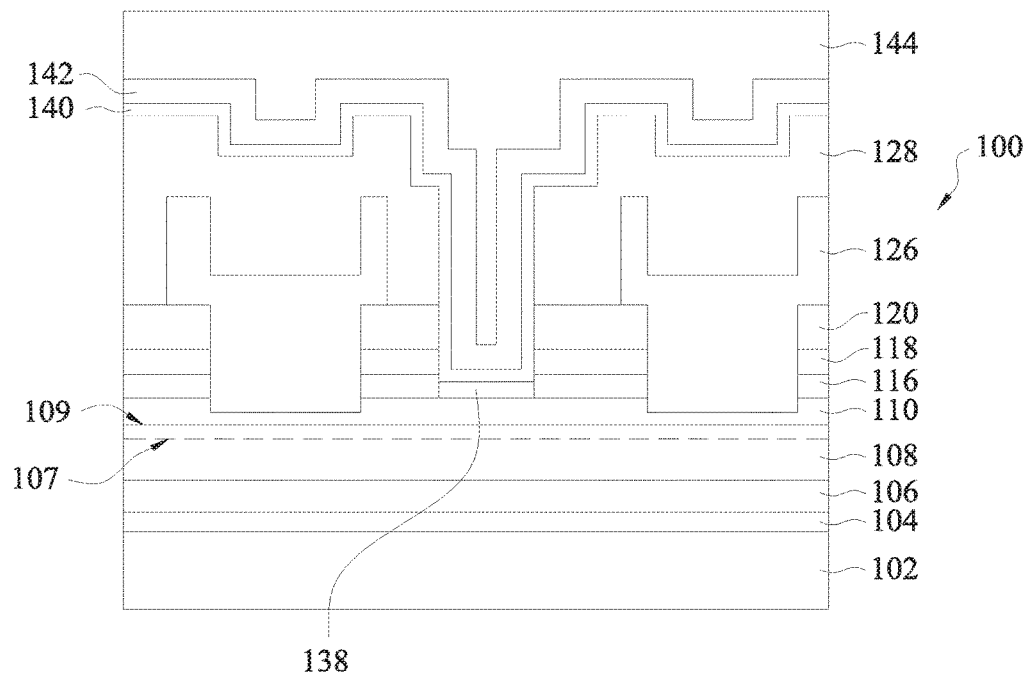
Figure 2T:
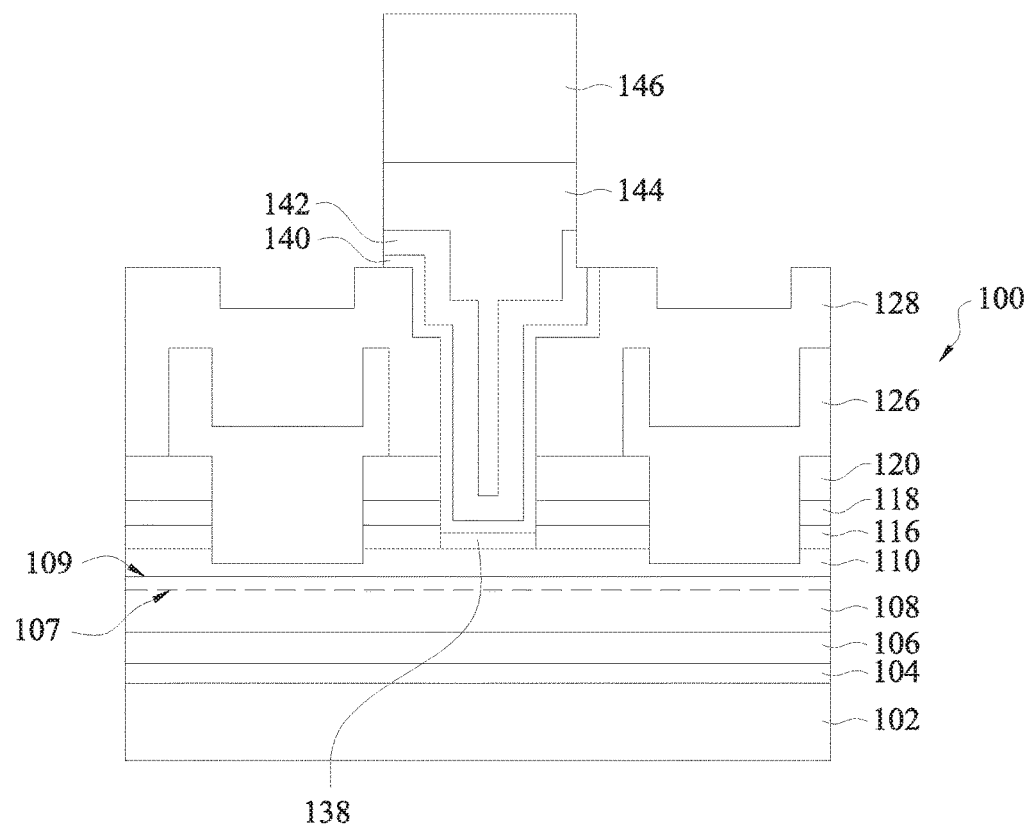
Figure 2U:
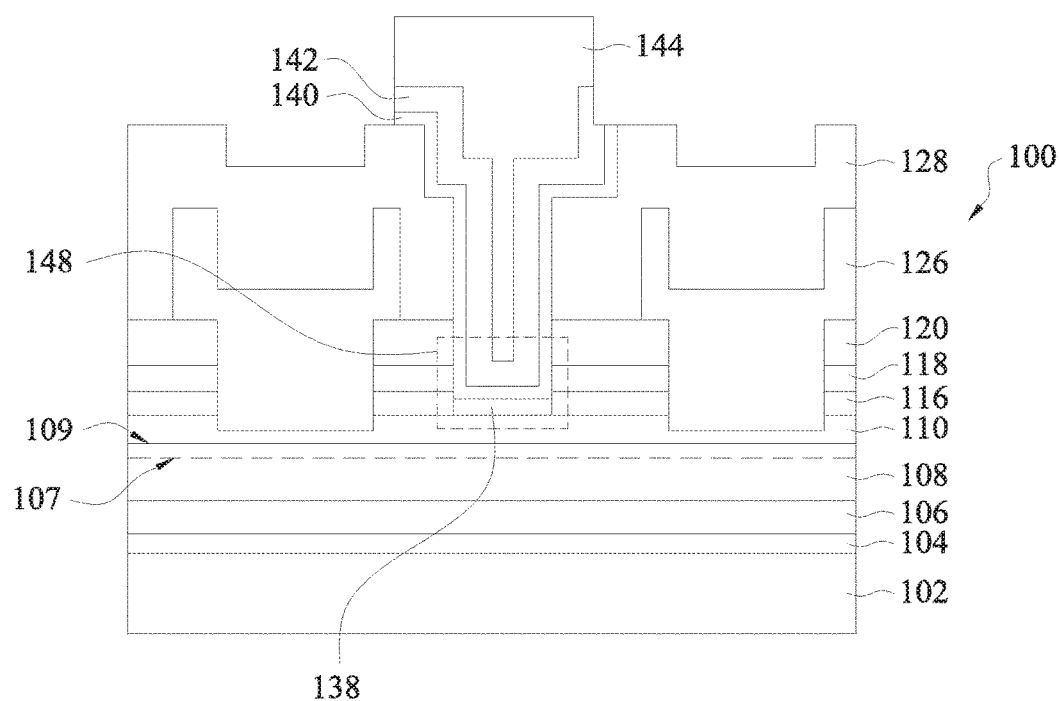

At operation 36, the method 10 (FIG. 1B) forms a gate electrode 144 over a portion of the gate dielectric layer 142, which is illustrated in FIGS. 2S, 2T, and 2U. Referring to FIG. 2S, a metal layer 144 is deposited over the gate dielectric layer 142 and filling in the opening 132 (FIG. 2R). The metal layer 144 may comprise one or more metals such as tantalum (Ta), titanium (Ti), tungsten (W), aluminum (Al), or combinations thereof in various embodiments. The metal layer 144 may also comprise nitrides (e.g., TiN or TaN) or carbides of the various metals. In embodiments, the metal layer 144 may comprise a single layer or multiple layers, such as a tungsten layer on a metal barrier layer. In embodiments, the metal layer 144 may be formed by CVD, PVD, plating, and/or other suitable processes. Referring to FIG. 2T, the metal layer 144 is patterned using a process including a photolithography process and one or more etching processes. The photolithography process defines and forms a masking element 146 (e.g., a patterned resist) overlying the metal layer 144, and the one or more etching processes etch the metal layer 144 using the masking element 146 as an etch mask. The remaining portion of the metal layer 144 becomes the gate electrode, also referred to as the gate electrode 144. In the embodiment shown in FIG. 2T, the one or more etching processes also etch the gate dielectric layer 142 and the interfacial layer 140 and stop at the capping layer 128. The one or more etching processes may include dry etching, wet etching, or other etching techniques. The masking element 146 is subsequently removed (FIG. 2U). Referring to FIG. 2U, a portion of the gate electrode 144 extends into the opening 132 (FIG. 2R) and overlays the III-V compound layer 110 through a layered structure 148 (enclosed by a dotted box in FIG. 2U). The layered structure 148 includes a portion of the gate dielectric layer 142, a portion of the interfacial layer 140, and the crystalline oxide layer 138 which is directly underneath the portion of the interfacial layer 140. In an embodiment, the portion of the interfacial layer 140 has a crystalline structure. Another portion of the gate electrode 144 overlays the capping layer 128 through another portion of the gate dielectric layer 142 and another portion of the interfacial layer 140 which may or may not have a crystalline structure.

FIGS. 3A through 3G illustrate cross-sectional views of intermediate stages in the formation of the HEMT 200 using a gate-first approach, i.e. a gate electrode of the HEMT 200 is formed before S/D electrodes of the HEMT 200 are formed. Many features of the HEMT 200 are similar to those of the HEMT 100. For the sake of simplicity, some reference numerals of the HEMT 100 are repeated in the HEMT 200 to indicate same or similar features. Further, the initial steps of these embodiments are essentially the same as shown in FIGS. 2A through 2G, and hence the details of those formation processes are not repeated herein.

Figure 3A:
FIGS. 3A, 3B, 3C, 3D, 3E, 3F, and 3G are cross-sectional views of a portion of a HEMT in various stages of a manufacturing flow according to the method in FIGS. 1A and 1B, in accordance with another embodiment.
Figure 3B:
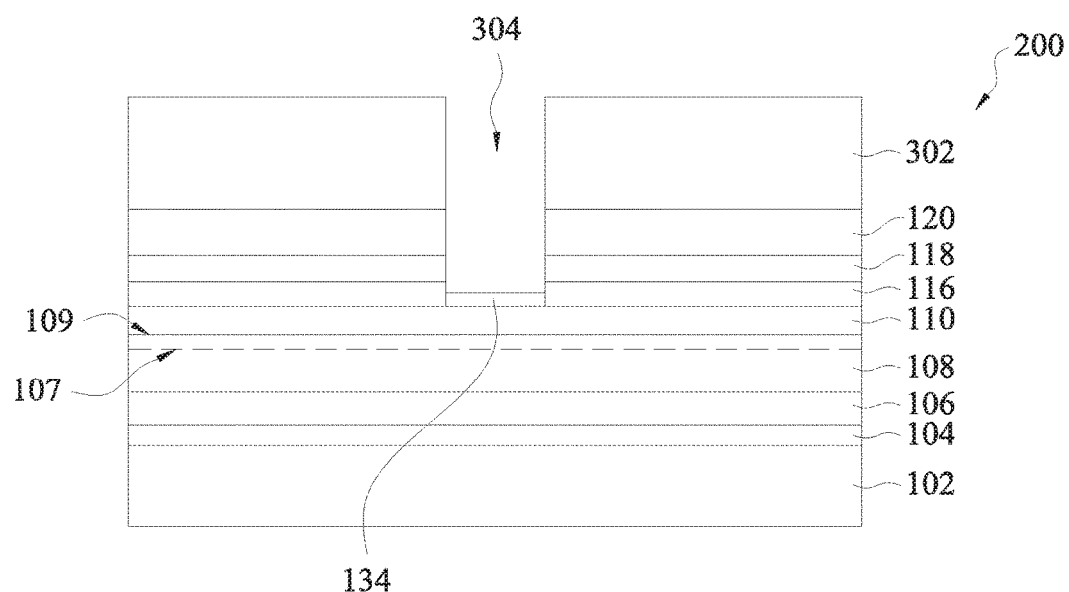

Next, as shown in FIG. 3A, a resist 302 is formed over the dielectric passivation layer 120. In FIG. 3B, the resist 302 is patterned using a lithography process to have an opening 304, and then the dielectric passivation layer 120, the crystalline interfacial layer 118, and the crystalline oxide layer 116 are etched through the opening 304 to expose a portion of the III-V compound layer 110. A native oxide layer 134 is formed over the portion of the III-V compound layer 110 because the III-V compound layer 110 is very active and the etching process chamber is not totally free of oxygen. The native oxide layer 134 has an amorphous structure, and is undesirable for the performance of the HEMT 200.

Figure 3C:
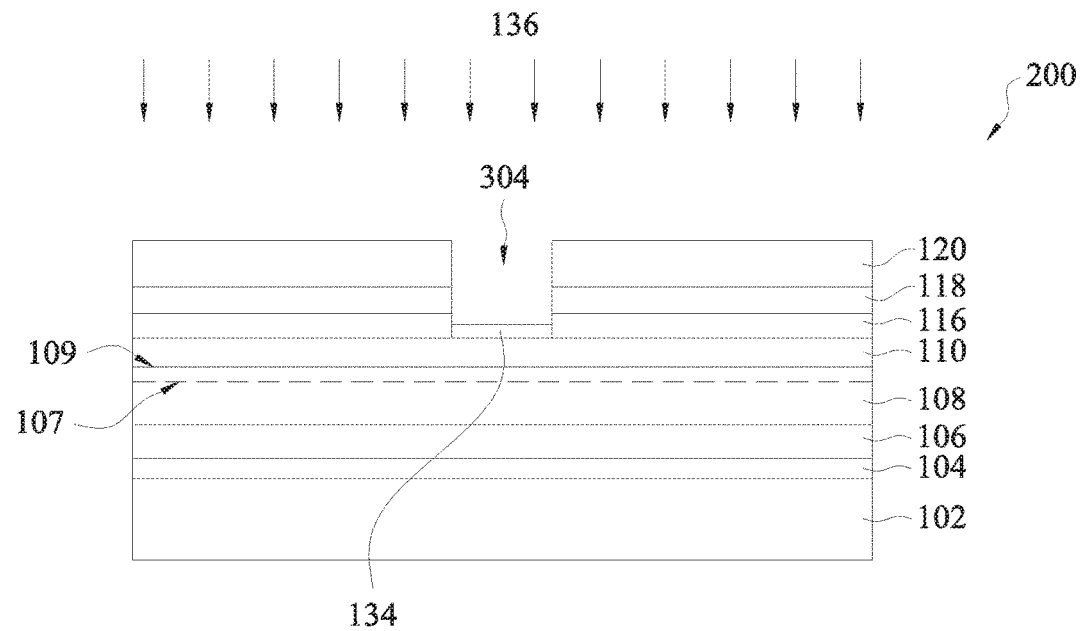
Figure 3D:
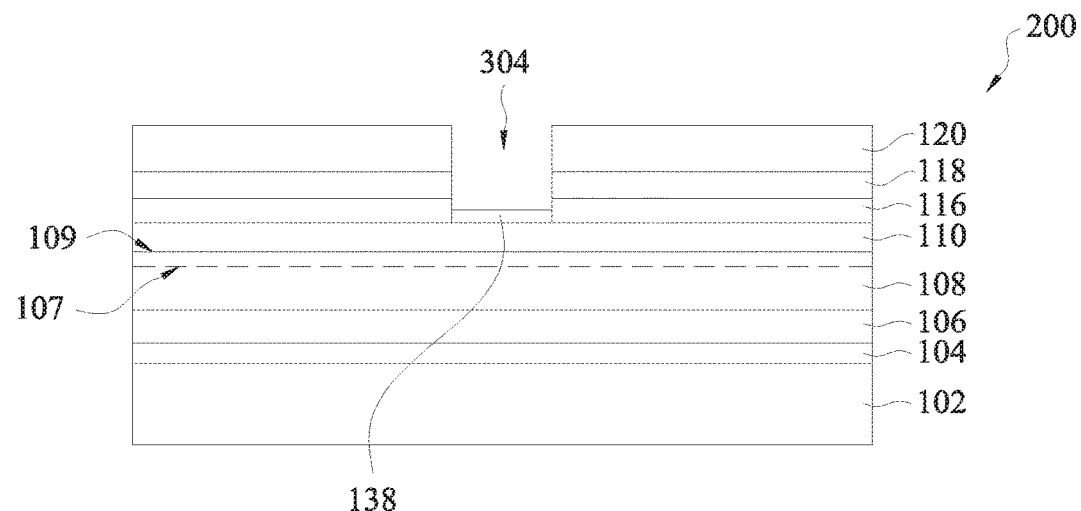

Next, referring to FIG. 3C, the native oxide layer 134 is in-situ treated with a gas 136. As a result, the native oxide layer 134 is converted to a crystalline oxide layer 138 (FIG. 3D). Next, in FIG. 3E, an interfacial layer 140 is deposited over the dielectric passivation layer 120 and on interior surfaces of the opening 304. In particular, a portion of the interfacial layer 140 is formed over the crystalline oxide layer 138. In an embodiment, this portion of the interfacial layer 140 has a crystalline structure. Therefore, the interfacial density of states is low between this portion of the interfacial layer 140 and the III-V compound layer 110. Further, as shown in FIG. 3E, a gate dielectric layer 142 is deposited over the interfacial layer 140.

Figure 3E:
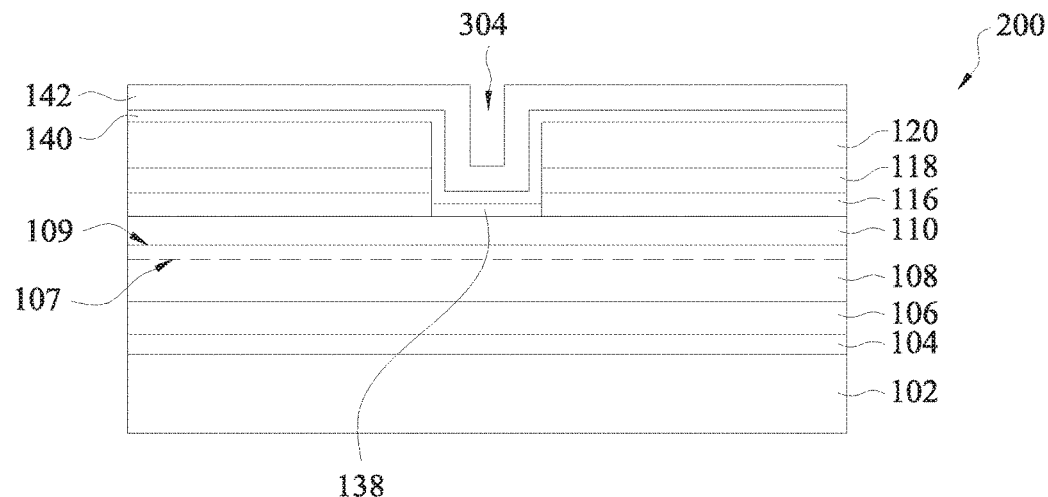
Figure 3F:
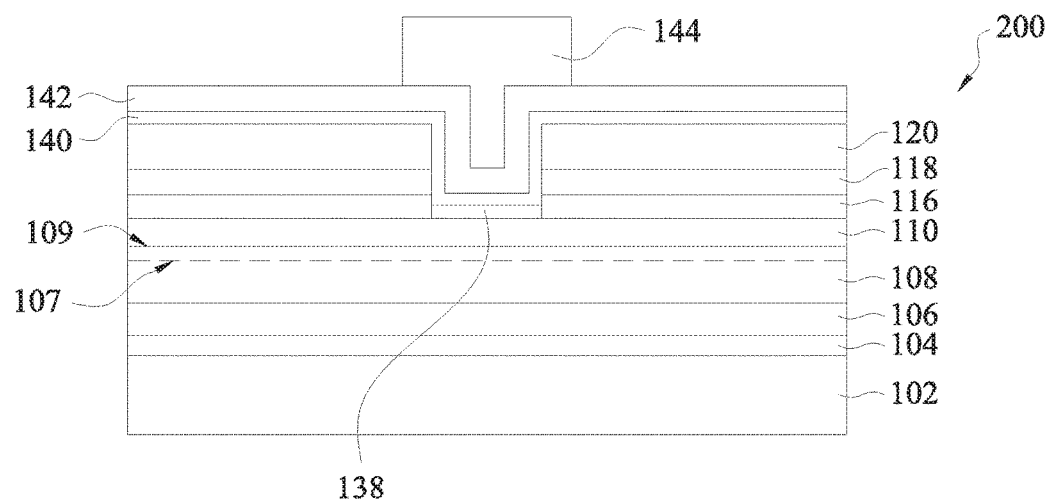
Figure 3G:
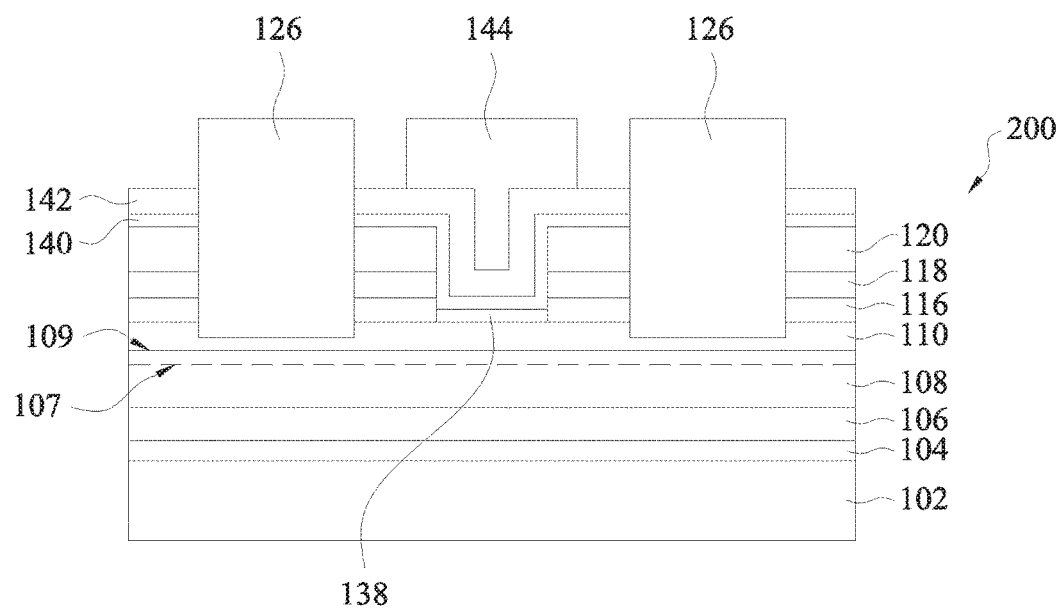

Next, in FIG. 3F, a gate electrode 144 is formed over a portion of the gate dielectric layer 142 and filling in the opening 304 of FIG. 3E. In an embodiment, the gate electrode 144 is formed by depositing a metal layer over the gate dielectric layer 142 and patterning the metal layer using photolithography and etching processes. Next, in FIG. 3G, two S/D electrodes 126 are formed on opposite sides of the gate electrode 144. In an embodiment, the S/D electrodes 126 are formed by etching S/D holes into the layers 142, 140, 120, 118, and 116 to expose portions of the III-V compound layer 110; depositing a metal layer into the S/D holes; and patterning the metal layer. In an embodiment, an inter-metallic compound (not shown) is formed as a result of reaction between the S/D electrodes 126 and the III-V compound layers 110 and 108 by a thermal annealing process.

Although not intended to be limiting, one or more embodiments of the present disclosure provide many benefits to a high electron mobility transistor (HEMT) and a formation process thereof. For example, during an intermediate stage of the formation of a HEMT, an III-V compound layer is epitaxially grown in a process chamber. The process chamber is not totally free of oxygen. Consequently, a native oxide layer is formed over the surface of the III-V compound layer. The native oxide layer has an amorphous structure and may degrade the performance of the HEMT. Embodiments of the present disclosure in-situ treat the native oxide layer with a gas, thereby converting it into a crystalline oxide layer. Embodiments of the present disclosure further form a crystalline interfacial layer, in-situ or ex-situ, over the crystalline oxide layer, and further form a dielectric passivation layer over the crystalline interfacial layer. The crystalline interfacial layer and the crystalline oxide layer reduce the interfacial density of states in an interface between the passivation layer and the III-V compound layer, and improve various performances of the HEMT.

In some embodiments of the present disclosure, a gate contact hole is etched to expose a portion of an III-V compound layer of a HEMT. Because the etching process chamber is not totally free of oxygen, a native oxide layer is formed over the surface of the III-V compound layer in the gate contact hole. Embodiments of the present disclosure treat the oxide layer with a gas, thereby converting it into a crystalline oxide layer. Embodiments of the present disclosure further form an interfacial layer, a portion of which is over the crystalline oxide layer; and further form a gate dielectric layer over the interfacial layer. The portion of the interfacial layer and the crystalline oxide layer reduce the interfacial density of states in an interface between the gate dielectric layer and the III-V compound layer, which improves various performances of the HEMT.

In one exemplary aspect, the present disclosure is directed to a method of forming a High Electron Mobility Transistor (HEMT). The method includes epitaxially growing a first III-V compound layer, and epitaxially growing a second III-V compound layer over the first III-V compound layer, wherein a first native oxide layer is formed on the second III-V compound layer. The method further includes in-situ treating the first native oxide layer with a first gas, thereby converting the first native oxide layer into a first crystalline oxide layer. The method further includes forming a first crystalline interfacial layer over the first crystalline oxide layer, and forming a dielectric passivation layer over the first crystalline interfacial layer.

In another exemplary aspect, the present disclosure is directed to a method of forming a High Electron Mobility Transistor (HEMT). The method includes epitaxially growing a first III-V compound layer comprising gallium nitride, and epitaxially growing a second III-V compound layer comprising aluminum gallium nitride over the first III-V compound layer, wherein a first native oxide layer is formed on the second III-V compound layer. The method further includes in-situ treating the first native oxide layer with a first gas, thereby converting the first native oxide layer into a first crystalline oxide layer. The method further includes forming a first crystalline interfacial layer over the first crystalline oxide layer, and forming a passivation layer over the first crystalline interfacial layer.

In yet another exemplary aspect, the present disclosure is directed to a High Electron Mobility Transistor (HEMT). The HEMT includes a first III-V compound layer having a first band gap and a second III-V compound layer having a second band gap over the first III-V compound layer, wherein the second band gap is greater than the first band gap. The HEMT further includes a first crystalline oxide layer over the second III-V compound layer, a first crystalline interfacial layer over the first crystalline oxide layer, a dielectric passivation layer over the first crystalline interfacial layer, two source and drain (S/D) electrodes over the second III-V compound layer, a gate electrode between the two S/D electrodes and over a first portion of the second III-V compound layer, and a layered structure between the gate electrode and the first portion of the second III-V compound layer. The layered structure includes a portion of a second interfacial layer and a portion of a gate dielectric layer over the portion of the second interfacial layer. In an embodiment, the layered structure further includes a second crystalline oxide layer between the first portion of the second III-V compound layer and the portion of the second interfacial layer.

The foregoing outlines features of several embodiments so that those of ordinary skill in the art may better understand the aspects of the present disclosure. Those of ordinary skill in the art should appreciate that they may readily use the present disclosure as a basis for designing or modifying other processes and structures for carrying out the same purposes and/or achieving the same advantages of the embodiments introduced herein. Those of ordinary skill in the art should also realize that such equivalent constructions do not depart from the spirit and scope of the present disclosure, and that they may make various changes, substitutions, and alterations herein without departing from the spirit and scope of the present disclosure.

What is claimed is:

1. A High Electron Mobility Transistor (HEMT), comprising:
   a first III-V compound layer having a first band gap;
   a second III-V compound layer having a second band gap over the first III-V compound layer, wherein the second band gap is greater than the first band gap;
   a first oxide layer over the second III-V compound layer;
   a first interfacial layer over the first oxide layer, wherein the first interfacial layer comprises a crystalline semiconductor material; and
   a passivation layer over the first interfacial layer.

2. The HEMT of claim 1, further comprising:
   a substrate; and
   one or more buffer layers between the substrate and the first III-V compound layer.

3. The HEMT of claim 1, wherein:
   the first III-V compound layer comprises gallium nitride; and
   the second III-V compound layer comprises aluminum gallium nitride.

4. The HEMT of claim 1, wherein the first oxide layer comprises crystalline oxynitride or crystalline aluminum oxynitride.

5. The HEMT of claim 1, wherein the crystalline semiconductor material includes aluminum nitride, indium aluminum gallium nitride, or boron nitride.

6. The HEMT of claim 1, further comprising:
   a gate electrode over a first portion of the second III-V compound layer; and
   a layered structure between the gate electrode and the first portion of the second III-V compound layer, wherein the layered structure includes a portion of a second interfacial layer and a portion of a gate dielectric layer over the portion of the second interfacial layer.

7. The HEMT of claim 6, wherein the layered structure further includes:
   a second oxide layer between the first portion of the second III-V compound layer and the portion of the second interfacial layer.

8. The HEMT of claim 7, wherein the portion of the second interfacial layer has a crystalline structure.

9. The HEMT of claim 1, further comprising:
   two source and drain (S/D) electrodes over the second III-V compound layer.

10. The HEMT of claim 6, wherein the first interfacial layer and the second interfacial layer have different thicknesses.

11. A High Electron Mobility Transistor (HEMT), comprising:
a substrate;
one or more buffer layers over the substrate;
a first III-V compound layer having a first band gap over the one or more buffer layers;
a second III-V compound layer having a second band gap over the first III-V compound layer, wherein the second band gap is greater than the first band gap;
a first crystalline oxide layer over the second III-V compound layer;
a first crystalline interfacial layer over the first crystalline oxide layer; and
a dielectric passivation layer over the first crystalline interfacial layer.

12. The HEMT of claim 11, wherein the first crystalline interfacial layer comprises one of: aluminum nitride, indium aluminum gallium nitride, and boron nitride.

13. The HEMT of claim 11, wherein the first crystalline oxide layer comprises one of: gallium oxynitride and aluminum oxynitride.

14. The HEMT of claim 11, further comprising:
a gate electrode over a first portion of the second III-V compound layer; and
a layered structure between the gate electrode and the first portion of the second III-V compound layer, wherein the layered structure includes a second crystalline oxide layer, a second interfacial layer over the second crystalline oxide layer, and a gate dielectric layer over the second interfacial layer.

15. The HEMT of claim 14, wherein the second interfacial layer has a crystalline structure.

16. A High Electron Mobility Transistor (HEMT), comprising:
a first III-V compound layer having a first band gap;
a second III-V compound layer having a second band gap over the first III-V compound layer, wherein the second band gap is greater than the first band gap;
a first crystalline oxide layer over the second III-V compound layer;
a first crystalline interfacial layer over the first crystalline oxide layer;
a dielectric passivation layer over the first crystalline interfacial layer;
two source and drain (S/D) electrodes over the second III-V compound layer;
a gate electrode between the two S/D electrodes and over a first portion of the second III-V compound layer; and
a layered structure between the gate electrode and the first portion of the second III-V compound layer, wherein the layered structure includes a portion of a second interfacial layer and a portion of a gate dielectric layer over the portion of the second interfacial layer.

17. The HEMT of claim 16, wherein the layered structure further comprises:
a second crystalline oxide layer between the first portion of the second III-V compound layer and the portion of the second interfacial layer.

18. The HEMT of claim 17, wherein the portion of the second interfacial layer has a crystalline structure.

19. The HEMT of claim 16, wherein:
the first III-V compound layer comprises gallium nitride;
the second III-V compound layer comprises aluminum gallium nitride;
the first crystalline oxide layer comprises one of: gallium oxynitride and aluminum oxynitride;
the first crystalline interfacial layer comprises one of: aluminum nitride, indium aluminum gallium nitride, and boron nitride; and
the second interfacial layer comprises one of: aluminum nitride, indium aluminum gallium nitride, and boron nitride.

20. The HEMT of claim 16, wherein:
the first crystalline interfacial layer and the second interfacial layer have different thicknesses.

* * * * *